United States Patent [19]

Lopata et al.

[11] Patent Number: 5,001,439
[45] Date of Patent: Mar. 19, 1991

[54] VERY LOW DISTORTION AMPLIFIER

[75] Inventors: Douglas D. Lopata, Boyertown; Dale H. Nelson, Shillington; Thayamkulangara R. Viswanathan, Wyomissing, all of Pa.

[73] Assignee: AT&T Bell Laboratories, Murray Hill, N.J.

[21] Appl. No.: 368,483

[22] Filed: Jun. 19, 1989

[51] Int. Cl.⁵ .............................................. H03F 3/45
[52] U.S. Cl. ..................................... 330/253; 330/257
[58] Field of Search ............... 330/252, 253, 257, 258, 330/261, 277, 288, 307, 311

[56] References Cited

U.S. PATENT DOCUMENTS 4,262,261  4/1981  Lafferty et al. ................ 330/257 X

OTHER PUBLICATIONS

Schilling, Donald L. and Belove, Charles, *Electronic Circuits: Discrete and Integrated*, McGraw-Hill 1979, pp. 350-357 and 393-398.

Primary Examiner—Steven Mottola
Attorney, Agent, or Firm—Scott W. McLellan

[57] ABSTRACT

An operational amplifier and method for making same, with predetermined common mode voltage gain, adapted to form an amplifier and a voltage regulator. The predetermined common mode voltage gain allows for substantially reduced differential mode gain and wider operating bandwidth with little distortion, compared to amplifiers and voltage regulators using operational amplifiers of the prior art. Further, examples of operational amplifiers, having the reduced differential mode gain and predetermined common mode gain, are given for implementation in CMOS and bipolar technologies.

3 Claims, 2 Drawing Sheets

VERY LOW DISTORTION AMPLIFIER

BACKGROUND OF THE INVENTION

1. Field of the Invention

This invention relates to amplifiers in general, and, more particularly, to wide-bandwidth operational amplifiers.

2. Description of the Prior Art

Operational amplifiers are the building blocks of many complex functions, such as analog-to-digital (A/D) and digital-to-analog (D/A) converters, instrumentation amplifiers, voltage regulators, etc. The operational amplifier (op amp) is commonly understood to have a differential input and a single-ended output. Ideally, the differential mode voltage gain (the amplification of a signal applied substantially between the differential inputs) of an op amp is infinite and common mode voltage gain (the amplification of a signal referenced to ground and applied to the differential inputs equally) is zero. Further, the bandwidth of an ideal op amp is infinite. Unfortunately, realizable op amps fall very short of this ideal. One consequence of less than infinite differential mode voltage gain and limited bandwidth is the distortion of signals passing through the op amp.

A conventional op amp 101, used as anon-inverting amplifier 100, is shown in FIG. 3. The input to the amplifier 100 is designated $V_{IN}$ and the output is designated $V_{OUT}$. It is noted that the designations of the input and output of the amplifier 100 also refers to the voltage of signals thereon. The op amp 101 is powered by voltages $V^{30}$ and $V^-$. The differential inputs, labeled + and − for the non-inverting and inverting inputs, respectively, couple to the input of the amplifier 100, $V_{IN}$, and to a feedback network of resistors 102, 103. Resistor 103, coupling to the output of the op amp 101, feeds back the voltage therefrom, attenuated by the voltage divider formed by the resistors 102, 103, to the inverting input to the op amp 101. Using $R_{102}$ and $R_{103}$ to refer to the resistances of resistors 102, 103, respectively, the gain (loss) of the voltage divider, K, is:

$$K = \frac{R_{103}}{R_{103} + R_{102}}; \quad (1)$$

and the approximate closed-loop voltage gain of the amplifier 100 can be expressed as:

$$\frac{V_{OUT}}{V_{IN}} = \frac{A_d}{1 + K A_d}; \quad (2)$$

where $A_d$ is the differential mode voltage gain of the op amp 101 and the common mode voltage gain, if any, is neglected. If the op amp 101 is an ideal op amp, i.e., $A_d = \infty$, the gain of the amplifier 100 is 1/K. However, when using a realizable op amp for the op amp 101, at low frequencies, the overall voltage gain of the amplifier 100 is not quite 1/K due to the finite differential mode voltage gain ($A_d$). Still further, the gain of the amplifier 100 decreases from 1/K with increasing input signal frequency (applied to $V_{IN}$). The reason for this is illustrated in FIG. 4 and discussed below.

In FIG. 4, a simplified gain (in dB) versus frequency plot (not to scale) of a realizable op amp is shown. Curve 110 corresponds to the differential voltage gain, $A_d$, of the op amp 101 (FIG. 1). Note that the differential gain, $A_d$, at low frequencies (zero Hz through approximately $f_{OL}$) is very high, typically 80 to 100 dB, and drops off until the gain reach 0 dB (unity gain) at the frequency $f_m$, commonly referred to as the gain-bandwidth product frequency. The gain-bandwidth product is a figure of merit used to measure the performance of the op amp. The $f_{OL}$, or open-loop dominant pole frequency, results from a dominant pole (typically a capacitor internal to the op amp 101, not shown) introduced into the op amp 101 to insure stability of the amplifier 100 (FIG. 3) due to the high differential gain of the op amp 101.

As discussed above, the overall voltage gain of the amplifier 100 deviates from 1/K when the frequency of the input signal is increased beyond $f_{OL}$. As can be demonstrated from above equation for the closed-loop voltage gain of the amplifier 100, when the differential voltage gain of the op amp 101 decreases, the gain of the amplifier 100 decreases from 1/K. This is illustrated by the dashed portion of the curve 111 shown deviating from the desired curve (solid line of curve 111). This decrease in gain in a source of distortion to wide bandwidth signals amplified by the amplifier 100. For example, pulses or high-fidelity audio signals amplified by the amplifier 100, will be rounded off and distorted. Further, voltage regulators, using amplifier 100 to regulate an output voltage, will not respond to load changes to the regulator as quickly as desired, requiring multiple and/or large high-frequency bypass capacitors on the output of the regulator. Hence, it is desirable to provide an op amp having wide bandwidth to minimize the distortion of signals amplified by the op amp without compromising the stability of the amplifier utilizing said op amp.

SUMMARY OF THE INVENTION

This and other aspects of the invention are provided for generally by having a differential amplifier (op amp) with a predetermined differential gain and a predetermined common mode voltage gain. This op amp is adapted to form an amplifier having a desired gain 1/K, the amplifier utilizing a feedback network with a predetermined gain (loss) of K, characterized by the amount of deviation of the gain of the amplifier from desired gain, 1/K, being determined by an equation relating the differential mode gain, the common mode gain, and the feedback loss to the deviation amount.

In one embodiment of the invention, the above-described op amp is adapted to form a voltage regulator, having a voltage reference $V_r$ and a feedback network with a predetermined gain (loss) of K. The voltage regulator is characterized by the amount of deviation of the output voltage of the voltage regulator from the desired output voltage, $V_r/K$, being determined by an equation relating the differential mode gain, the common mode gain, and the feedback loss to the deviation amount.

Still further, the method for designing an amplifier and a voltage regulator utilizing the above-described op amp is presented.

In a preferred embodiment, the above-identified op amp is characterized by a differential input stage, having a transconductance $g_m$, with differential inputs, first and second outputs and a common output; a first resistor, having a resistance $R_c$, coupled to the common output of the differential input stage; a current mirror, having an input and at least one output with an output current to input current transfer ratio of G, the input thereof coupled to the first output of the differential input stage; a load resistor, having a resistance $R_L$, coupled to the output of the current mirror; wherein the differential mode voltage gain of the differential amplifier is approximately:

$$g_m \, G \, R_L; \quad (3)$$

and the common mode voltage gain is approximately:

$$\frac{G \, R_L}{2 \, R_c}. \quad (4)$$

BRIEF DESCRIPTION OF THE DRAWING

The foregoing features of this invention, as well as the invention itself, may be more fully understood from the following detailed description of the drawings, in which.

DETAILED DESCRIPTION

By reducing the differential mode voltage gain of an op amp, the open loop dominant pole frequency ($f_{OL}$) may be increased considerably since stability is less critical with reduced differential mode voltage gain. To compensate for the reduced differential gain, the op amp is adapted to have a predetermined common mode voltage gain.

Figure 3:
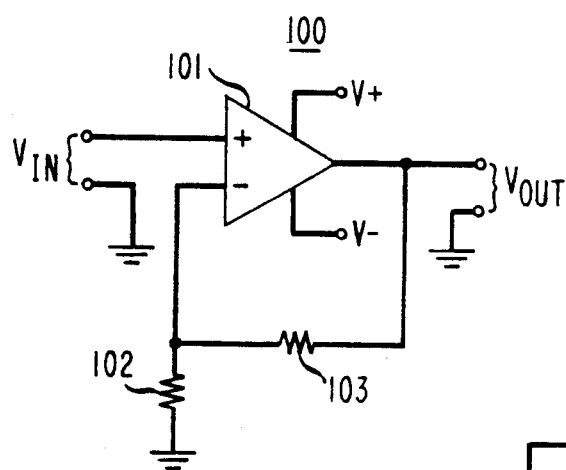
FIG. 3 is an operational amplifier adapted to form an amplifier.
Figure 4:
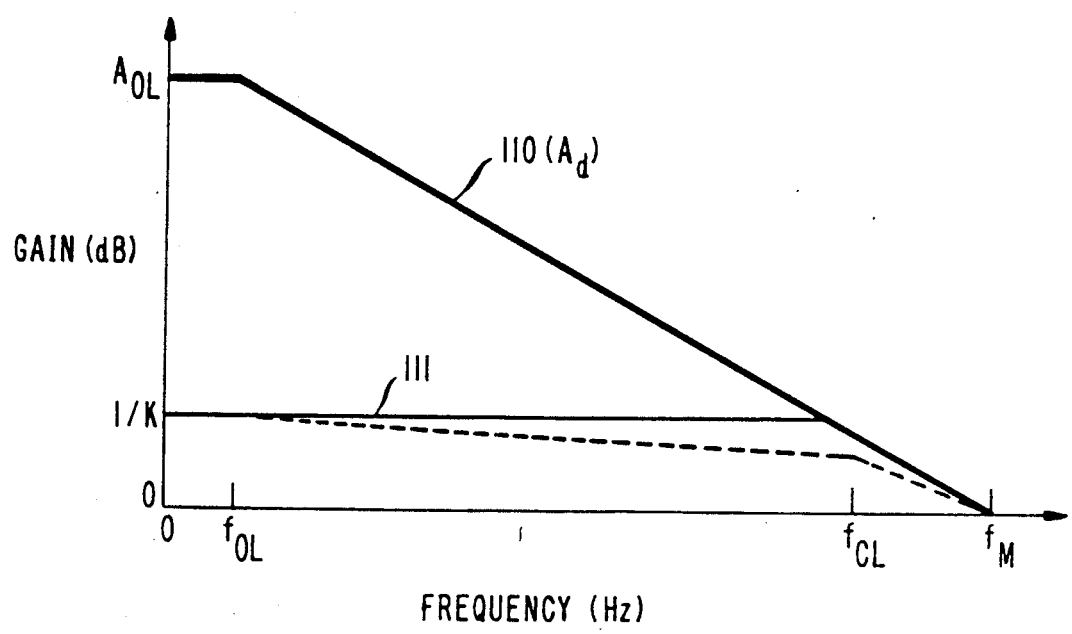
FIG. 4 is a simplified gain verses frequency plot of an operational amplifier in open- and closed-loop configuration; and, FIG. 5 is an operational amplifier adapted to form a voltage regulator.

As described above, in FIG. 3, an op amp 101 is shown configured to form a non-inverting amplifier 100 having a voltage gain substantially 1/K for frequencies less than $f_{OL}$ (FIG. 4). When equation (2) is rewritten to include common mode voltage gain, the closed-loop voltage gain of amplifier 100 becomes:

$$\frac{V_{OUT}}{V_{IN}} = \frac{A_d + A_c/2}{K(1/K + A_d - A_c/2)}; \quad (5)$$

where $A_d$ is the differential mode gain and $A_c$ is the common mode gain of the op amp 101, and K is the gain (loss) of the voltage divider network formed by resistors $R_{102}$ and $R_{103}$, given above. Rewriting equation (5) for the closed-loop voltage gain and recognizing that the ideal voltage gain of the amplifier 100 is 1/K, then the closed-loop voltage gain can be represented by:

$$\frac{V_{OUT}}{V_{IN}} = (1/K)(1 - \epsilon); \quad (6)$$

where $\epsilon$ represents the amount of deviation (error) of the resulting closed-loop gain of the amplifier 100 from the desired closed-loop gain. Combining equations (5) and (6) and solving for $\epsilon$, yields:

$$\pm \epsilon \approx \frac{A_d + A_c/2}{1/K + A_d - A_c/2} - 1. \quad (7)$$

It is noted that if $A_c$ is exactly 1/K (the ideal case), then the error $\epsilon$ is zero regardless of $A_d$. However, practical, mass-produced, op amps cannot be made with the circuit components therein having sufficient accuracy to make this practical. Hence, the differential gain, $AT_d$ is used to compensate for deviation in $A_c$ from ideal.

It is further noted that for using the amplifier 100 as a unity gain buffer, i.e., the closed-loop gain is approximately one, resistor $R_{102}$ is removed and the inverting input to the op amp 101 is coupled to the output thereof. In this case, $A_c$ should be approximately one and $A_d$ determined as described below.

To design an amplifier 100 with a desired voltage gain 1/K, and with an op amp 101 having both differential mode gain and a common mode gain, the desired bandwidth of the amplifier 100 is first established. Knowing the desired bandwidth of the amplifier 100, the dominant pole is set in the op amp 101, described above, to be significantly higher than the maximum frequency to be amplified. This ensures that minimal distortion will occur to an amplified signal due to gain reduction by the op amp 101 with increasing frequency. The differential gain of the op amp 101 is then determined so as to provide sufficient phase margin to ensure stability of the amplifier 100 with variations in differential gain due to processing variations during manufacture of the op amp 101.

Once the required differential mode gain is established, the minimum and maximum common mode gain $A_c$ is determined from the differential mode gain and the maximum acceptable deviation from the desired closed-loop gain, $\epsilon$, at frequencies within the desired bandwidth of the amplifier 100. Solving the equation (7) for $A_c$, yields:

$$A_c \approx \frac{\epsilon + 1 + K \epsilon A_d}{K(1 + \epsilon/2)}. \quad (8)$$

Since $\epsilon$ can be positive as well as negative, solving the above equation yields a minimum and a maximum $A_c$. It is noted that since variations in processing during manufacture of the integrated circuit (not shown), embodying the op amp 101, will vary component values therein, $A_d$ will vary over a range. Therefore, when using the above equation, the smallest expected differential gain value should be used. The op amp 101 is then designed to provide the necessary $A_d$ and $A_c$ such that $A_c$ remains within the above minimum and maximum $A_c$ with variations in the processing, discussed above.

EXAMPLES

An illustrative example of using the above design techniques to design an amplifier 100, as shown in FIG. 3, is given herein. For purposes here, the op amp 101 has an exemplary minimum differential gain, $A_d$, of one thousand (60 dB). If the amplifier 100 is to have a desired closed-loop voltage gain of five (1/K = 5), and a maximum gain deviation, $\epsilon$, of ±0.1%, the calculated common mode voltage gain, $A_c$, may range from approximately four to six. Without the common mode voltage gain ($A_c = 0$), $\epsilon$ would be approximately −0.5%. Conversely, using a conventional op amp 101 (no substantial common mode voltage gain, $A_c$), for a error of 0.1%, $A_d$ must be at least 5,000 (approximately 74 dB). Hence, for similar gain-bandwidth products, amplifier 100 has a bandwidth approximately 5 times that possible using conventional op amps. Exemplary embodiments of such an op amp 101 be discussed below associated with FIGS. 1 and 2.

Figure 5:
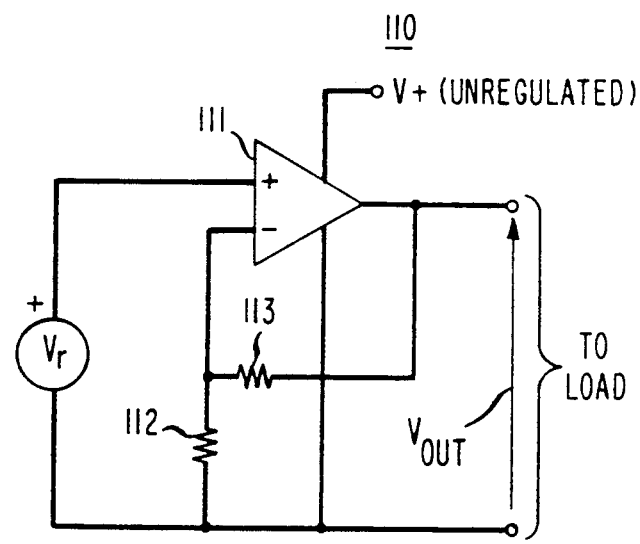

A second illustrative example of using the above design techniques to design an amplifier 100, as shown in FIG. 3, but used for providing a predetermined (regulated) output voltage to a load. This exemplary voltage regulator 110 is shown in FIG. 5. Such a voltage regulator 110 will have the advantage of responding to transients (changes in the power consumption of the load) faster (a wider "bandwidth") than voltage regulators known in the prior art using conventional op amps. In FIG. 5, the op amp 110 is powered by an unregulated input voltage, V+, to provide a predetermined (regulated) output voltage, $V_{OUT}$, across a load (not shown). A voltage reference $V_r$, typically a bandgap voltage reference, is coupled to the non-inverting input (+) of the op amp 111 and a voltage divider, of resistors 112, 113, feeds back the output voltage from the op amp 111 to the inverting input (−) thereof. The output voltage, $V_{OUT}$, across the load (not shown) coupled to the output of the op amp 111, is approximately $V_r/K$ where K is the gain (loss) of the voltage divider formed by the resistors 112, 113:

$$K = \frac{R_{112}}{R_{112} + R_{113}} ; \tag{9}$$

where $R_{112}$ and $R_{113}$ represent the resistances of resistors 112, 113, respectively. For an exemplary output voltage of eight and a reference voltage, $V_r$, of approximately 1.33 volts, the closed-loop voltage gain, 1/K is six. Using the same $A_d$ and $\epsilon$ as in the above example, one thousand and ±0.1% (the output voltage, $V_{OUT}$, is held to within eight millivolts of eight volts), $A_c$ may range from approximately five to seven. If, however, the voltage gain $A_d$ is reduced to one hundred, then $A_c$ must range within approximately 5.9 to 6.1 to achieve an $\epsilon$ of ±0.1% or less. Although the tolerance on $A_c$ is tighter, the reduced $A_d$ allows for the "bandwidth" of the voltage regulator to be approximately 10 times that with an op amp 111 having an $A_d$ of 1000, or approximately 50 times that possible with conventional op amps. The wider "bandwidth" of such a voltage regulator 101 provides faster responses to load transients. This reduces the need for many large bypass capacitors on the output of the voltage regulator 101 to absorb these transients. For example, using such a voltage regulator to power digital IC's, fewer and smaller bypass capacitors will be needed. Typically, the number and/or size of the capacitors is reduced by one or two orders of magnitude, thus reducing system costs.

EXEMPLARY EMBODIMENTS

Figure 1:
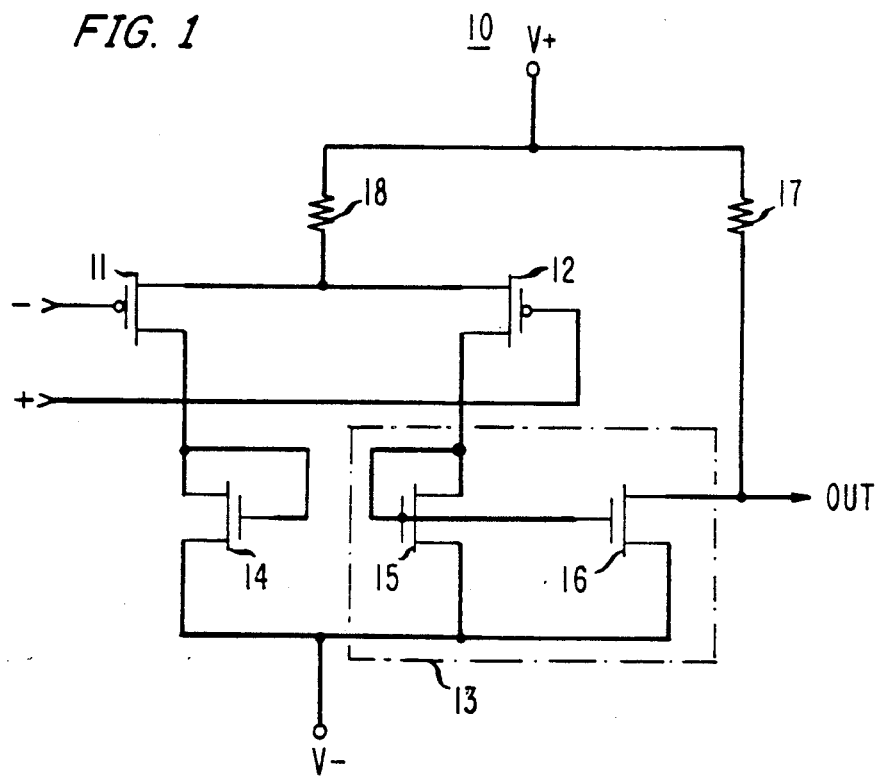
FIG. 1 is a simplified circuit diagram of a CMOS operational amplifier according to the invention.
Figure 2:
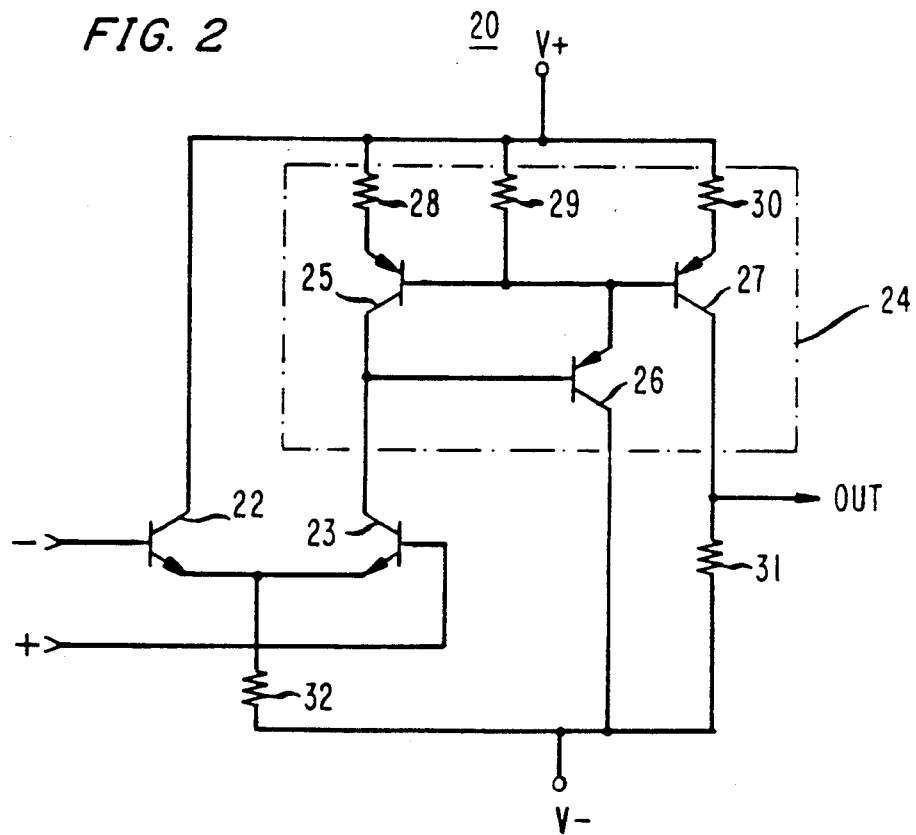
FIG. 2 is a simplified circuit diagram of a bipolar operational amplifier according to the invention.

Two exemplary embodiments of the aspects given above are shown in FIG. 1, a complementary metal-oxide-semiconductor (CMOS) technology op amp 10, and in FIG. 2, a bipolar technology op amp 20. It is understood that the shown embodiments are illustrative and other technologies and/or circuit configurations may be used to implement the above aspects.

In FIG. 1, a differential gain stage, formed by field-effect transistors (FET) 11, 12 couples to the inverting (−) and non-inverting (+) inputs of the op amp 10, respectively. The drain of FET 12 couples to a simple current mirror 13, referenced to V− and formed by FETs 15, and 16. FET 14, substantially the same size as FET 15, serves as a load to FET 11. FET 16, mirroring the current in through FET 16 to the current through FET 15 is a predetermined current mirror current-transfer ratio, $G_c$. It is will known that the current-transfer ratio is determined by the ratio of the sizes of the FETs 15, 16. Other types of current mirrors may be used in place of the current mirror 13 as shown, such as a cascode current mirror or a Wilson current mirror. Resistor 17 sets the overall voltage gain, for both the differential mode and common mode, of the op amp 10. Resistor 18, coupled to the common sources of FETs 11, 12, establishes the common mode voltage gain of the op amp 10. More particularly, using $g_m$ to represent the transconductance of the differential gain stage served by FETs 11, 12, the differential mode voltage gain is approximately:

$$A_d \simeq R_{17} g_m G_c; \tag{10}$$

and the common mode voltage gain is approximately:

$$A_c \simeq \frac{R_{17} G_c}{2 R_{18}} ; \tag{11}$$

where $R_{17}$ and $R_{18}$ is the resistances of the resistors 17, 18, respectively.

It is understood that the transconductance of FET 11, is substantially the same as the transconductance of FET 12. It is also understood that another amplifier stage (not shown) may be added to the op amp 10, coupled to the output node, OUT. This amplifier, such as a power buffer, provides sufficient drive for the op amp 10 to power external loads (not shown).

In FIG. 2, a differential gain stage, formed by bipolar transistors 22, 23, couples to the inverting (−) and non-inverting (+) inputs of the op amp 20, respectively. The collector of transistor 23 couples to a simple current mirror 24, referenced to V+, which acts as an active load to transistor 23. Current mirror 24 comprises transistor 25, 26, 27 and resistors 28, 29, 30. For simplicity, the current mirror 24 has a predetermined current-transfer ratio of $G_b$, defined here as the ratio of the current out of the current mirror 24 (from transistor 27), divided by the current into the current mirror 24 from transistor 23. Operation of the current mirror 24 is well understood, but, for purposes here, the ratio of the sizes of the transistors 25, 27 and of the resistances of resistors 28, 30 sets the current-transfer ratio, $G_b$. It is understood that other types of current mirrors may be used, such as a compound or Wilson mirror, having a predetermined current-transfer ratio, $G_b$.

Resistor 31 acts as a load for the current from the current mirror 24, producing across it the output voltage on the output node OUT. The overall gain, both common mode and differential mode, is set by the resistance of resistor 31. Resistor 32, coupling to the common emitters of the differential pair formed by transistors 22, 23, provides for the common mode gain $A_c$ in the op amp 20. Therefore, the approximate differential mode voltage gain of the op amp 20 is:

$$A_d \simeq G_b R_{31} g_m; \tag{12}$$

and the approximate common mode voltage gain is:

$$A_c \simeq \frac{G_b R_{31}}{2 R_{30}} ; \tag{13}$$

where $R_{31}$ and $R_{32}$ are the resistances of resistors 31 and 32, respectively, and $g_m$ is the transconductance of the differential input stage formed by transistors 22, 23. It is understood that the transconductance of transistors 22 and 23 are substantially the same. As with the op amp 10 of FIG. 1, another amplifier, typically a power buffer (not shown), can be coupled to the output node OUT to drive loads requiring substantial power, such as for the voltage regulator 110 shown in FIG. 5.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. An integrated circuit having at least one operational amplifier, the operational amplifier being adapted to form an amplifier having a desired closed-loop gain 1/K over a desired bandwidth, the amplifier utilizing a feedback network with a predetermined gain (loss) of K, characterized by:

the operational amplifier having a specific predetermined common mode gain, $A_c$, approximately equal to the desired closed-loop gain, 1/K over mode gain, $A_d$, and a maximum differential mode gain;

wherein the differential mode gain, $A_d$, is reduced from the maximum gain such that the deviation of the closed-loop gain of the amplifier from 1/K over the desired bandwidth does not exceed a predetermined amount; and, wherein the predetermined amount of deviation of the closed-loop gain of the amplifier from the desired gain 1/K is approximately:

$$\frac{A_d + A_c/2}{1/K + A_d - A_c/2} - 1;$$

2. The integrated circuit as recited in claim 1, wherein the closed-loop gain and the common mode gain are approximately one.

3. An integrated circuit having at least one operational amplifier, the operational amplifier being adapted to form a voltage regulator with a desired bandwidth, the voltage regulator having a voltage reference $V_r$, a feedback network with a predetermined gain (loss) of K, and a desired regulated output voltage of $V_r/K$, characterized by:

the operational amplifier having a specific predetermined common mode gain, $A_c$, approximately equal to 1/K, a differential mode gain, $A_d$, and a maximum differential gain;

wherein the differential mode gain, $A_d$, is reduced from the maximum differential mode gain such that the deviation of the output voltage of the regulator from the desired output voltage $V_r/K$ over the desired bandwidth does not exceed a predetermined amount; and, wherein the predetermined amount of deviation of the output voltage of the regulator from the desired output voltage $V_r/K$ is approximately:

$$\frac{A_d + A_c/2}{1/K + A_d - A_c/2} - 1;$$

* * * * *